United States Patent
Mende et al.

(10) Patent No.: US 9,557,399 B2
(45) Date of Patent: Jan. 31, 2017

(54) DYNAMIC COMPENSATION CIRCUIT

(71) Applicant: Tektronix, Inc., Beaverton, OR (US)

(72) Inventors: Michael J. Mende, Portland, OR (US); Richard A. Booman, Lake Oswego, OR (US)

(73) Assignee: TEKTRONIX, INC., Beaverton, OR (US)

( * ) Notice: Subject to any disclaimer, the term of this patent is extended or adjusted under 35 U.S.C. 154(b) by 193 days.

(21) Appl. No.: 14/188,299

(22) Filed: Feb. 24, 2014

(65) Prior Publication Data

US 2015/0241543 A1 Aug. 27, 2015

(51) Int. Cl.
*G01R 31/00* (2006.01)
*G01R 35/00* (2006.01)
*G01R 15/24* (2006.01)
*G01R 1/067* (2006.01)

(52) U.S. Cl.
CPC ........... *G01R 35/00* (2013.01); *G01R 1/06766* (2013.01); *G01R 15/24* (2013.01); *G01R 31/00* (2013.01)

(58) Field of Classification Search
USPC ........... 324/601, 750.01, 149, 750.02, 750.3, 324/684, 705, 754.03, 754.07; 455/67.11, 455/67.14, 115.2, 73; 702/104, 116, 117, 702/121, 182, 189, 57, 64, 85, 91; 385/12
See application file for complete search history.

(56) References Cited

U.S. PATENT DOCUMENTS

| | | | | |
|---|---|---|---|---|
| 4,803,423 A * | 2/1989 | Boutigny | ........... | G01R 1/06766 324/130 |
| 6,870,359 B1 * | 3/2005 | Sekel | ........... | G01R 35/005 324/73.1 |
| 7,460,983 B2 * | 12/2008 | Pickerd | ........... | G01R 31/3191 702/104 |
| 8,791,689 B2 | 7/2014 | Peschke et al. | | |
| 2001/0028251 A1 * | 10/2001 | Okayasu | ........... | G01R 35/005 324/532 |
| 2004/0151201 A1 * | 8/2004 | Dandy | ........... | H04L 12/403 370/451 |
| 2005/0201658 A1 * | 9/2005 | Yakymyshyn | ........... | G02F 1/035 385/12 |

(Continued)

FOREIGN PATENT DOCUMENTS

WO 2008019740 A1 2/2008

OTHER PUBLICATIONS

Extended European Search Report for European Patent Application No. 15156242.8, dated Jul. 30, 2015, 6 pages, European Patent Office, Munich, Germany.

*Primary Examiner* — Melissa Koval
*Assistant Examiner* — Nasima Monsur
(74) *Attorney, Agent, or Firm* — Marger Johnson

(57) ABSTRACT

A test and measurement system including a device under test, an accessory, a controller and a test and measurement instrument. The accessory is connected to the device under test and includes a signal input to receive an input signal from the device under test, a compensation unit configured to apply a compensation signal internal to the accessory, and a signal output to output an output signal read from the device under test. The controller is connected to the accessory and includes one or more receivers to receive the input signal and the output signal from the accessory, and a microcontroller or correction circuit configured to compare the input signal and the output signal and in response to the comparison provide a compensation signal to the compensation unit.

10 Claims, 3 Drawing Sheets

(56) References Cited

U.S. PATENT DOCUMENTS

2007/0143638 A1* 6/2007 Dobyns ............ G01R 1/06788
 713/300
2011/0074390 A1* 3/2011 Bartlett ............ G01R 1/06766
 324/76.41

* cited by examiner

DYNAMIC COMPENSATION CIRCUIT

TECHNICAL FIELD

This disclosure relates to the field of electronic test and measurement instruments and accessories therefore. The disclosed technology specifically addresses the problem of dynamically compensating a probe accessory while it is being used to make a measurement for the electronic instruments.

BACKGROUND

Traditionally, compensating an accessory, such as a probe, in a test and measurement system involves removing the accessory from a device under test (DUT) and connecting the accessory to a calibrating or compensation stimulus. Conventionally, the test and measurement system includes a host, a controller, and a device under test. An accessory is attached to the device under test and measures a signal from the device under test and sends it back to the host. However, to compensate the accessory, the accessory has to be removed from the device under test and attached to a calibration/compensation stimulus, typically located on the host. Connecting the probe/accessory to the calibration or compensation stimulus may involve the use of special adapters and fixtures to interface between probe/accessory and the stimulus signal.

Using optical sensors to accurately measure down to DC has not had much success in the past. Optical sensors are susceptible to changes in the surrounding environment. Temperature, mechanical stress, and the signals applied to the optical sensor can cause the DC/LF offset component of the sensor to shift dramatically making it unusable or result in significant measurement errors.

What is needed is the ability to dynamically calibrate or compensate an accessory in real time, while it is operating, to eliminate the need to manually connect the accessory to a calibration or compensation signal and also the need to remove the accessory from a DUT to calibrate or compensate the probe. This dynamic compensation should be transparent to the user.

SUMMARY

Certain embodiments of the disclosed technology include a test and measurement system including a device under test, an accessory, a controller and a test and measurement instrument. The accessory is connected to the device under test and includes a signal input to receive an input signal from the device under test, a compensation unit configured to dynamically apply a compensation signal internal to the accessory, and a signal output to output an output signal read from the device under test. The controller is connected to the accessory and includes one or more receivers to receive the input signal and the output signal from the accessory, and a microcontroller configured to compare the input signal and the output signal and in response to the comparison dynamically provide a compensation signal from the compensation unit in real time while it is making a measurement.

Other embodiments include a method of internally calibrating an accessory in a measurement system including a host, a controller and a device under test. The method includes receiving at the accessory an input signal from a device under test, outputting an output signal from the accessory based on the input signal, comparing the output signal and the input signal at the controller and determining a compensation value, and providing the compensation value to a compensation unit in the accessory or in the host test and measurement instrument to compensate the output signal from the device under test.

DETAILED DESCRIPTION

Figure 1:
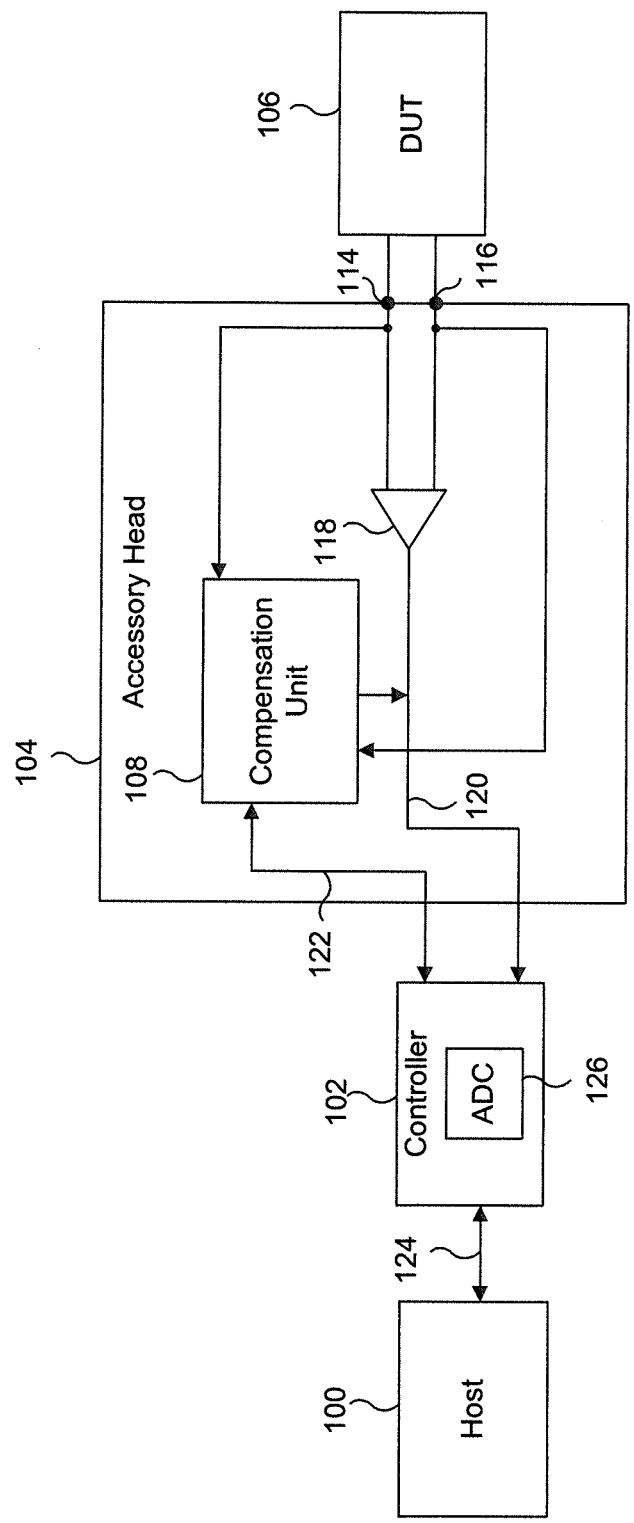
FIGS. 1 and 2 illustrate embodiments a measurement system with an accessory head that contains a compensation unit.

In the drawings, which are not necessarily to scale, like or corresponding elements of the disclosed systems and methods are denoted by the same reference numerals.

There are times when an accessory attached to a DUT cannot be easily removed in order to calibrate or compensate the accessory. For example, the accessory could be permanently installed in a test fixture, soldered to a DUT, installed at a hard-to-access or remote location, in an environmental chamber, or in a hazardous location, such as a location with high voltage. Accordingly, in situations such as these, it is important to be able to calibrate or compensate the accessory without removing the accessory from the DUT.

Some embodiments of the disclosed technology enable the use of an optical voltage sensor, as discussed in more detail below, to measure an electrical signal from direct current (DC) to Gigahertz (GHz) by dynamically compensating for the DC/LF (Low Frequency) instabilities of the optical sensor over time as it is making a measurement. The output of the optical sensor is susceptible to changes in the environment and the signal and bias applied to the sensor. Adding correction circuitry, as discussed in more detail below, enables the development of a completely electrically isolated, DC coupled, high bandwidth, high sensitivity differential accessory head with high common mode rejection and voltage range.

Embodiments of the disclosed technology includes a test and measurement system that includes a host 100, such as a test and measurement instrument, a controller 102, an accessory head 104, and a DUT 106. One example of such a system is shown in FIG. 1. The accessory head 104 includes a compensation unit 108, which is described in more detail below.

During a measurement operation, a signal from the DUT 106 is received at inputs 114 and 116 of the accessory head 104. The measured signal is then sent through an amplifier 118 and to the host 100 through the main signal path 120 and path 124. The compensation unit 108 also sends back the monitored portion of the measurement signal that will be used for compensation of the system.

The compensation is done continuously. Since the compensation signal from the compensation unit 108 is known, the compensation signal from the compensation unit 108 can be applied at the host 100 or controller 102 to the output signal.

Figure 2:
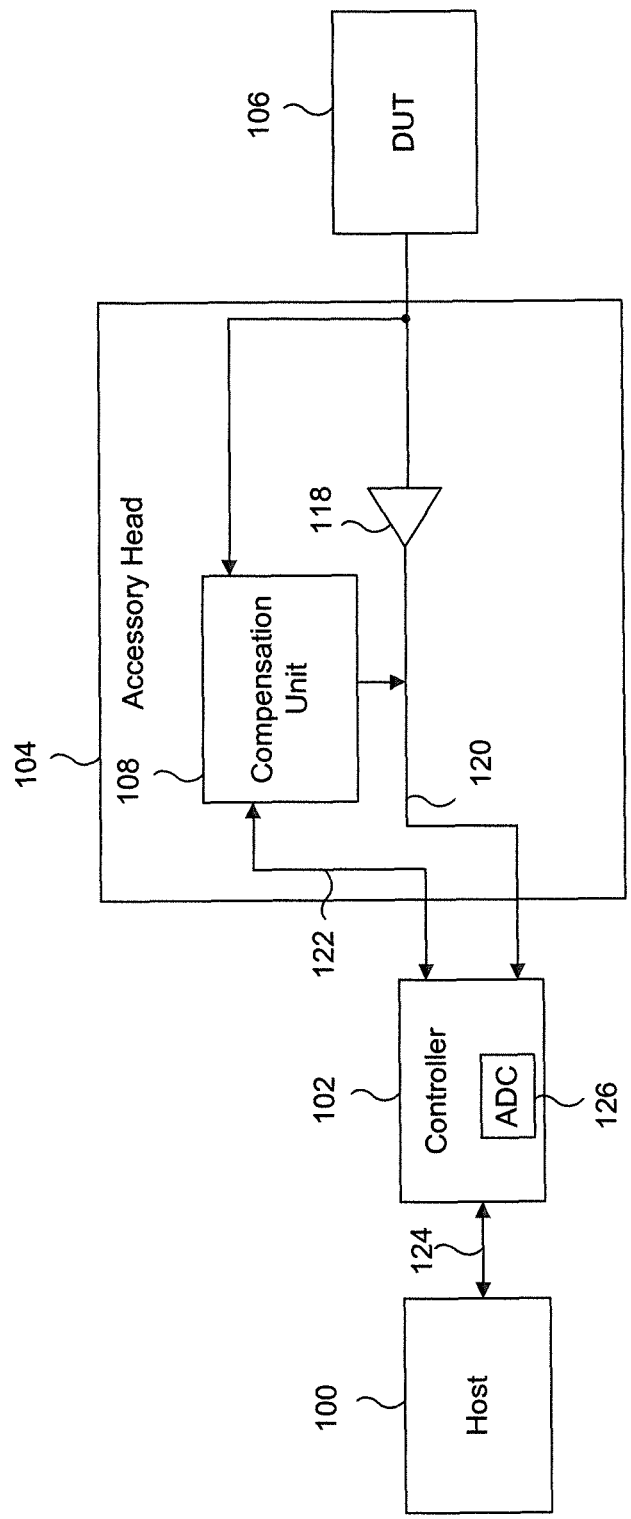

To determine the amount of compensation in the test and measurement system shown in FIGS. 1 and 2, the input signal from the DUT 106 is sent not only to amplifier 118, but also to the compensation unit 108. Compensation unit 108 then forwards the input signal from the DUT 106 to the controller 102 for analysis. The output signal from the amplifier 118 is also sent to the controller 102 for analysis.

Although not shown, the output signal and input signal may also be analyzed internally in the accessory head 104. The controller 102 compares the input signal and the output signal and determines the DC/LF offset error from the comparison of these signals. A resulting compensation value is determined based on the DC/LF offset error to minimize the DC/LF offset error when supplied by the compensation unit. The compensation value is then sent from the controller 102 to the compensation unit 108 in the accessory head 104. This cycle is preferably continually repeated to maintain a minimum offset drift error in the measurement of the signals from DUT 106.

FIG. 1 shows a differential accessory head to receive two inputs from the DUT 106. However, the compensation unit 108 may also be used in an accessory head 104 with a single-ended input, as shown in FIG. 2. The system of FIG. 2 would work identically to that shown in FIG. 1 except only a single input is received.

Figure 3:
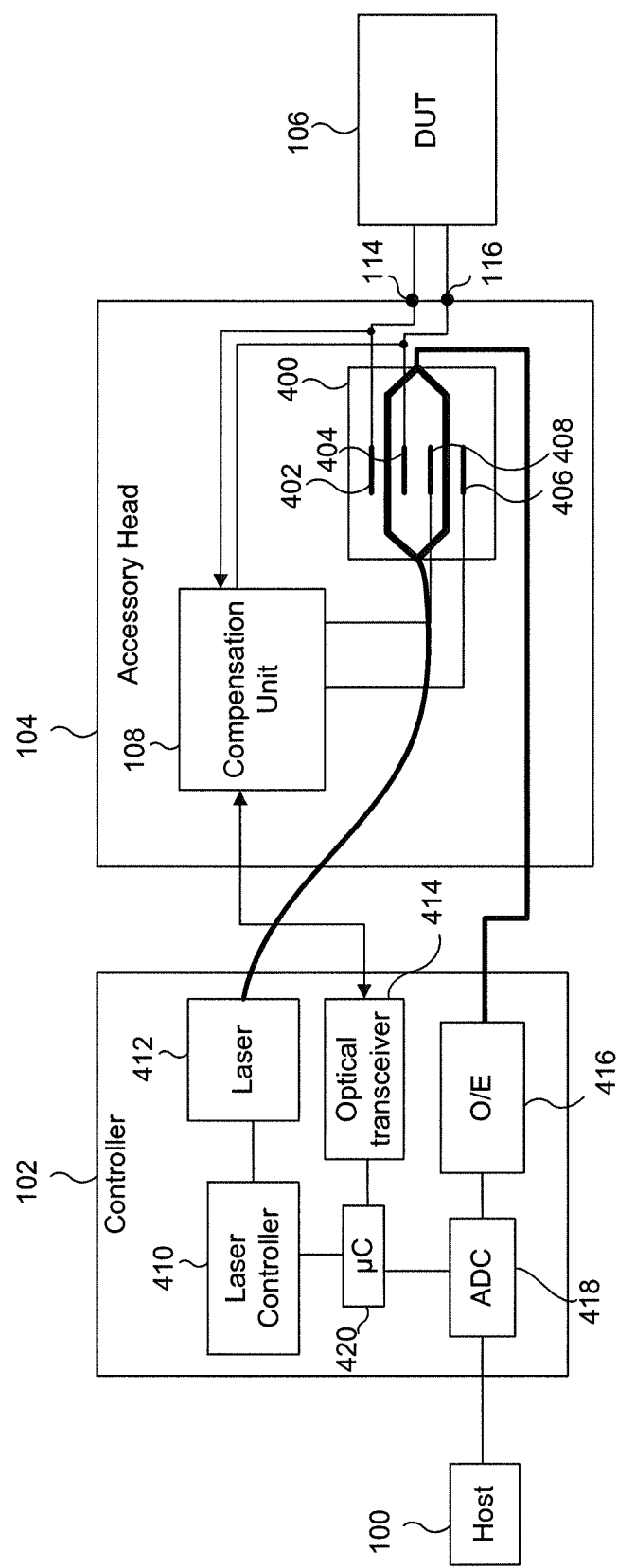
FIG. 3 illustrates a measurement system with an accessory head that includes an optical sensor and a compensation unit.

As shown in FIG. 3, the accessory head 104 may include an optical sensor if the accessory head 104 is an optical accessory head. If such is the case, the measurement system shown in FIG. 3 would still include a host 100, a controller 102, a compensation unit 108 and a DUT 106, as discussed above with respect to FIGS. 1 and 2. Rather than using an amplifier 118, the measurement system of FIG. 3 includes an optical sensor 400. The optical sensor 400 may be, for example, a Mach-Zehnder optical sensor. However, other optical sensors may be used as well Inputs 114 and 116 of the accessory head 104 are connected to signal input electrodes 402 and 404. The output from the signal input electrodes 402 and 404 are sent from the optical sensor 400 to the controller 102 through the main signal path 120. Compensation unit 108, on the other hand, is connected to the control electrodes 406 and 408 of the optical sensor 400 which are separated and electrically isolated from the signal input electrodes 402 and 404.

When an optical sensor 400 is used, the controller 102 includes a laser controller 410, a laser 412, an optical transceiver 414, an optical-to-electrical converter 416, an analog-to-digital converter 418 and a microcontroller 420.

The amount of compensation to be applied to the control electrodes 406 and 408 is determined similar to that discussed above with respect to FIGS. 1 and 2. The input signals 114 and 116 from the DUT 106 are sent not only to the input signal path electrodes 402 and 404, but also sent to the compensation unit 108. The input signals are then sent to the optical transmitter 414 and finally microprocessor 420 for analysis. Although not shown, the input signals are converted to digital signals via an analog-to-digital converter connected to the compensation unit 108. The output from the optical sensor 400 after reading the signal from the DUT 106 is sent to the optical-to-electrical converter 416 in the controller 102 and then further processed through an analog-to-digital converter 418. The output from the analog-to-digital converter 418 could be sent to both the host 100 for display on a display of the host or storage in a memory (not shown) and the microcontroller 420 in the controller 102 for analysis.

Similar to that discussed above, the microcontroller 420 compares the input signal and the output signal to determine a DC/LF offset error. Then, a compensation value can be determined based on the comparison that will minimize the DC/LF offset error when applied to the control electrodes 406 and 408 in the optical sensor 400. The compensation value determined by the microcontroller 420 is sent back to the compensation unit 108 thru optical transceiver 414. The compensation unit 108 then applies the compensation value to the control electrodes 406 and 408. The input signals and output signals are constantly monitored and sent to the microcontroller 420 in the controller 102. This allows for a compensation value to be continually determined to maintain a minimum offset drift error. A correction circuit may also be used rather than a microcontroller 420.

The disclosed technology is capable of not only calibrating, for example, direct current voltage, but can also be used to compensate the gain or frequency of an alternating current voltage.

The disclosed technology is also not limited to use on a voltage probe. The accessory device may be any type of transducer device or general accessory device requiring voltage, current, power, etc., for operation, such as a measurement probe, measurement probe adapter, active filter devices, probe calibration fixture, probe isolation accessory, or the like.

The host 100 may be a test and measurement instrument, such as an oscilloscope, logic analyzer, spectrum analyzer or similar such devices having an accessory device interface for accepting an accessory device.

The connection to the controller 102 of the accessory head 104 may be a wired, optical fiber or a wireless connection as known to one of ordinary skill in the art. If the DUT 106 and accessory head 104 are located at a remote location, it may be necessary to have a wireless connection. Any of the signal paths 120, 122 and 124 may be a wired or wireless connection as known to one of ordinary skill in the art.

In some embodiments (not shown) a controller is not required. Rather, all of the components of the controller 102 shows with respect to FIGS. 1-4 are located with the host 100.

The term "controller" and "processor" as used herein is intended to include microprocessors, microcomputers, ASICs, and dedicated hardware controllers and associated memories. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. A test and measurement system, comprising:
   an accessory connected to a device under test, including:
      a signal input configured to receive an input signal from the device under test,
      an amplifier configured to amplify the input signal to create an amplified input signal,
      a compensation unit configured to receive the input signal and continuously apply a compensation signal to the amplified input signal based on a compensation value internal to the accessory to create a compensated input signal, and output the input signal,
      a first signal path configured to output the compensated input signal of the device under test, and
      a second signal path configured to forward the input signal and receive the compensation value;
   a controller connected to the accessory, including:
      a first connection to receive the input signal from the accessory and output the compensation value to the compensation unit, and
      a second connection to receive the compensated input signal from the accessory,
      wherein the controller is configured to compare the compensated input signal and the input signal and, in response to the comparison, determine the compensation value; and
   a test and measurement instrument connected to the controller.

2. The system of claim 1, wherein the accessory is a transducer.

3. The system of claim 2, wherein the transducer is a voltage probe or a current probe.

4. The system of claim 1, wherein the controller is further configured to output the compensated input signal to the test and measurement instrument for display on a display of the test and measurement instrument.

5. The system of claim 1, wherein the compensation unit is further configured to apply the compensation signal when the accessory is attached to the device under test.

6. A method of internally compensating an accessory in a measurement system including a host, a controller and a device under test, the method comprising:
   receiving at the accessory an input signal from a device under test;
   amplifying the input signal to create an amplified input signal;
   continuously applying a compensation signal, by a compensation unit, to the amplified input signal to create a compensated input signal;
   outputting the compensated input signal to a controller;
   forwarding the input signal to the controller,
   comparing the compensated input signal and the input signal at the controller to determine a compensation value; and
   outputting the compensation value, from the controller to the compensation unit in the accessory for continuous application of the compensation signal to the amplified input signal from the device under test.

7. The method of claim 6, wherein the compensation signal is sent while the accessory is attached to a device under test.

8. The method of claim 6, further comprising providing the compensated input signal as an output signal to the test and measurement instrument.

9. The system of claim 1, wherein the controller includes a microcontroller to determine the compensation value.

10. The system of claim 1, wherein the controller includes a correction circuit to determine the compensation value.

* * * * *